(12) United States Patent
Assanelli et al.

(10) Patent No.: US 11,433,669 B2
(45) Date of Patent: Sep. 6, 2022

(54) METHOD OF MANUFACTURING A STACKED PIEZOELECTRIC TRANSDUCER, AND PIEZOELECTRIC TRANSDUCER

(71) Applicant: STMicroelectronics S.r.l., Agrate Brianza (IT)

(72) Inventors: Davide Assanelli, Milan (IT); Irene Martini, Bergamo (IT); Lorenzo Vinciguerra, Novara (IT); Carla Maria Lazzari, Casatenovo (IT); Paolo Ferrarini, Casatenovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/879,269

(22) Filed: May 20, 2020

(65) Prior Publication Data
US 2020/0369029 A1 Nov. 26, 2020

(30) Foreign Application Priority Data
May 24, 2019 (IT) .......................... 102019000007213

(51) Int. Cl.
*B41J 2/14* (2006.01)
*H01L 41/047* (2006.01)
(Continued)

(52) U.S. Cl.
CPC ...... *B41J 2/14274* (2013.01); *H01L 41/0475* (2013.01); *H01L 41/0533* (2013.01);
(Continued)

(58) Field of Classification Search
None
See application file for complete search history.

(56) References Cited

U.S. PATENT DOCUMENTS

| 5,481,490 A | 1/1996 | Watanabe et al. |
| 2013/0140959 A1* | 6/2013 | Shin .................. H03H 3/02 310/349 |

(Continued)

FOREIGN PATENT DOCUMENTS

EP 3173235 A1 5/2017

OTHER PUBLICATIONS

IT Search Report and Written Opinion for IT Appl. No. 102019000007213 dated Feb. 18, 2020 (7 pages).
(Continued)

*Primary Examiner* — Erica S Lin
(74) *Attorney, Agent, or Firm* — Crowe & Dunlevy (57) ABSTRACT

A piezoelectric transducer includes a semiconductor body with a bottom electrode of conductive material. A piezoelectric element is on the bottom electrode. A first protective layer, on the bottom electrode and the piezoelectric element, has a first opening through which a portion of the piezoelectric element is exposed, and a second opening through which a portion of the bottom electrode is exposed. A conductive layer on the first protective layer and within the first and second openings is patterned to form a top electrode in electrical contact with the piezoelectric element at the first opening, a first biasing stripe in electrical contact with the top electrode, and a second biasing stripe in electrical contact with the bottom electrode at the second opening.

22 Claims, 4 Drawing Sheets

(51) Int. Cl.
*H01L 41/053* (2006.01)
*H01L 41/09* (2006.01)
*H01L 41/187* (2006.01)
*H01L 41/23* (2013.01)
*H01L 41/29* (2013.01)
*H01L 41/332* (2013.01)

(52) U.S. Cl.
CPC ...... *H01L 41/0973* (2013.01); *H01L 41/1876* (2013.01); *H01L 41/23* (2013.01); *H01L 41/29* (2013.01); *H01L 41/332* (2013.01)

(56) References Cited

U.S. PATENT DOCUMENTS

2016/0121610 A1\* 5/2016 Ashikaga ............... B41J 2/1646
347/70
2018/0079210 A1 3/2018 Ashikaga

OTHER PUBLICATIONS

Dubois, Marc-Alexandre, et al: "PZT Thin Film Actuated Elastic Fin Micromotor," IEEE Transactions on ultrasonics, Ferroelectrics, and Frequency Control, vol. 45, No. 5, Sep. 1998, pp. 1169-1177.

\* cited by examiner

METHOD OF MANUFACTURING A STACKED PIEZOELECTRIC TRANSDUCER, AND PIEZOELECTRIC TRANSDUCER

PRIORITY CLAIM

This application claims the priority benefit of Italian Application for Patent No. 102019000007213, filed on May 24, 2019, the content of which is hereby incorporated by reference in its entirety to the maximum extent allowable by law.

TECHNICAL FIELD

This disclosure relates to a method of manufacturing a piezoelectric transducer, and to a piezoelectric transducer.

BACKGROUND

It is known to manufacture piezoelectric-based transducers, or actuators, such as for example from PZT (Pb, Zr, $TiO_3$) material. The piezoelectric transducers may then be used in a variety of technical fields, such as for inkjet printing, autofocus systems, speakers, etc.

Usually, the piezoelectric transducer includes a stack where a piezoelectric element is sandwiched between a bottom electrode and a top electrode. Proper biasing of the top and bottom electrodes actuates the PZT element according to the needs of the application.

The top electrode is usually sputtered directly on top of the piezoelectric element and both layers are then etched (e.g., with a same photoresist mask). The bottom electrode is instead patterned with a dedicated etching step. The whole stack is then passivated, vias are formed through the passivation layer to form the electrical contacts for bias, and metal stripes/pads are formed through a further metal deposition and etch.

The top electrode, in the standard process flow, is therefore subjected to several process steps which may affect its integrity and reliability. At the same time, the piezoelectric element also undergoes process steps which may alter its properties and the piezoelectric physical response as a function of the biasing voltage, leading to premature piezoelectric aging.

FIGS. 1A-1D illustrates, in a lateral cross-sectional view, a process flow for manufacturing a stacked piezoelectric transducer, or actuator.

Figure 1A:
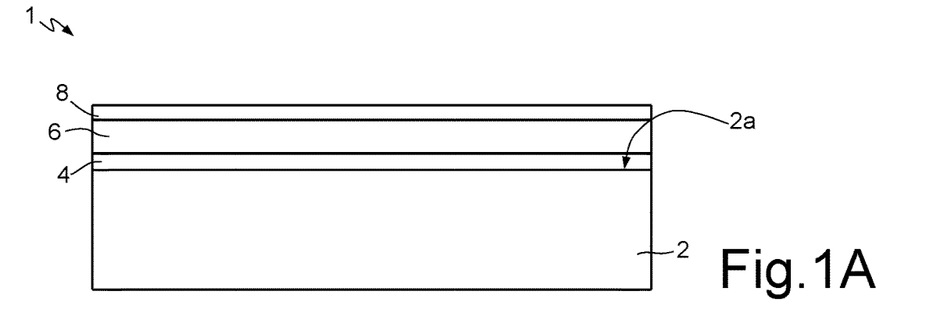
FIGS. 1A-1D show, in cross-sectional view, steps for manufacturing a piezoelectric transducer according to a prior art embodiment.

With reference to FIG. 1A, a wafer 1 is provided, including a substrate 2 made of semiconductor material, such as silicon. On a first surface 2a of the substrate 2 a stack including a piezoelectric element and electrodes for actuation of the piezoelectric element is formed. The formation of the stack includes depositing a first layer of conductive material 4; then, on the first layer of conductive material 4, a layer of piezoelectric material 6, is deposited; then, on the layer of piezoelectric material 6 is deposited a second layer of conductive material 8, for example a metal material such as for example Ru or Pt.

Figure 1B:
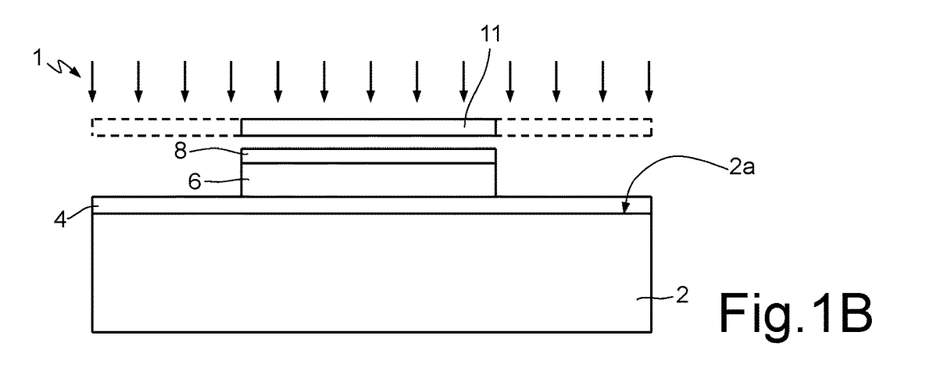

Then, in FIG. 1B, a mask 11 is formed or arranged on the second layer of conductive material 8, to cover an area of the second layer of conductive material 8 corresponding to portions of the latter that will form, subsequently, a top electrode for actuating the piezoelectric element 6. An etching step (e.g., dry etching) allows removal of portions of the second layer of conductive material 8 not protected by the mask 11. Using the same mask 11, but a different etching chemistry, etching of the wafer 1 (e.g., dry etching) is continued to remove exposed portions of the layer of piezoelectric material 6 so as to form a piezoelectric element. Etching is stopped at the first layer of conductive material 4, and the mask 11 is removed.

One or more after-etch cleaning steps may then be carried out.

Figure 1C:
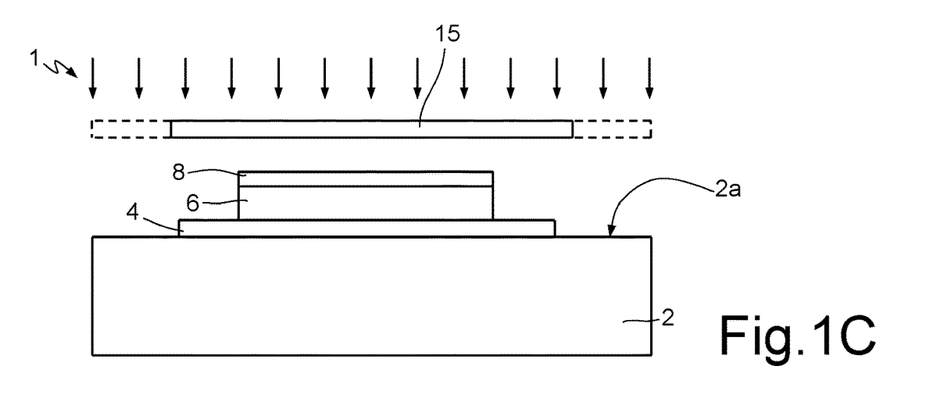

Then, in FIG. 1C, a mask 15 (for example, a photoresist mask) is formed; the mask 15 is designed to protect the top electrode 8 and the piezoelectric element 6, and to expose portions of the first layer of conductive material 4 which has to be removed. An etching step is then carried out, to remove the portions of the first layer of conductive material 4 not protected by the mask 15. A bottom electrode, for actuating the piezoelectric element 6 during use, is thus formed.

Then, the mask 15 is removed from the wafer 1, and a step of deposition of a passivation layer 18 on the wafer 1 is carried out. The passivation layer 18 is, for example, silicon oxide ($SiO_2$) deposited by CVD.

Figure 1D:
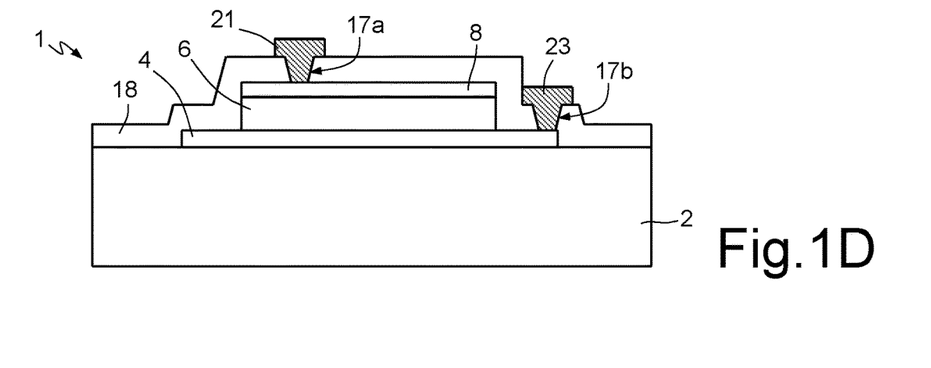

With reference to FIG. 1D, vias 17 are opened through the passivation layer 18, using the top electrode 6 and the bottom electrode 4 as stopping layers, to expose surface regions of the top and of the bottom electrodes 6, 4, which can hence be contacted electrically by respective conductive stripes 21, 23, for example formed by deposition of conductive material, such as a metal, for example titanium and gold.

The conductive stripes 21, 23 extend on the wafer 1, reaching regions where it is desired to form conductive pads, designed to operate as electrical access points for biasing, during use, the top electrode 8 and the bottom electrode 4 so as to activate the piezoelectric element 6.

As it is apparent from the above, the top electrode 8 is exposed to several process steps, including chemicals usually used to clean the stack after the dry etch, these steps affecting negatively the top electrode performances and integrity. Also the cleaning steps of the bottom electrode 4 may have an impact on the top electrode 8, e.g. by changing its conductivity properties (sheet resistance and morphology). To avoid, or limit in part, the negative impacts on the top electrodes, specific materials may be selected for the top electrode, thus limiting the process integration capabilities.

It is also noted that the top electrode 8 is the stopping layer for the vias etch, which may significantly impact on its integrity.

Furthermore, the piezoelectric element 6 with top electrode 8 is subjected to several thermal budgets during manufacturing, e.g., during the passivation deposition and metal deposition, which is undesired. In fact, it is well known that piezoelectric properties of the above-described stacked structure are affected by annealing treatments.

SUMMARY

The aim of this disclosure is to provide a method of manufacturing a piezoelectric transducer, and a piezoelectric transducer, that overcome the drawbacks of the known art.

According to this disclosure, a method of manufacturing a piezoelectric transducer, and a piezoelectric transducer, are provided, as defined in the annexed claims.

BRIEF DESCRIPTION OF THE DRAWINGS

For a better understanding of the present invention, preferred embodiments thereof are now described purely by way of non-limiting example with reference to the attached drawings, wherein.

DETAILED DESCRIPTION

FIGS. 2-8 show, in the context of a Cartesian (triaxial) reference system of axis X, axis Y, and axis Z, steps for manufacturing a piezoelectric transducer, or actuator, according to an embodiment disclosed herein.

Figure 2:
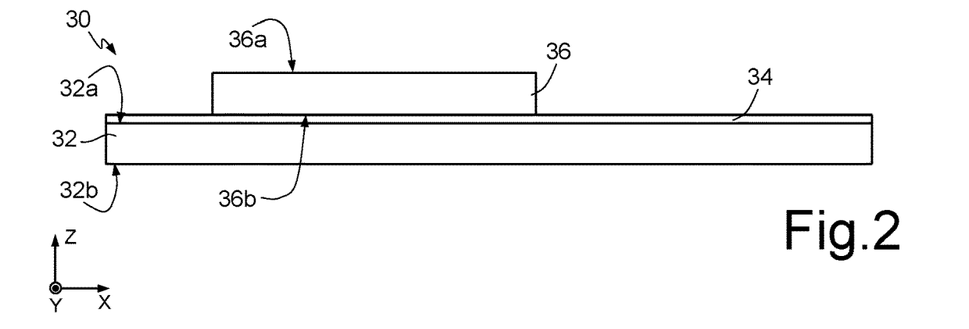
FIGS. 2-8 show, in cross-sectional view, steps for manufacturing a piezoelectric transducer according to an embodiment disclosed herein.

With reference to FIG. 2, a wafer 30 is provided, including a semiconductor body 32 (in the following, named "substrate" without losing generality) made at least in part of semiconductor material, such as silicon or a silicon compound.

A first electrode layer 34 is formed on a first surface 32a of the substrate 32, in particular by depositing a conductive material such as metal, and in particular, materials which can provide good piezoelectric layer orientation such as Platinum (Pt), Titanium/Platinum (TiPt) or Iridium (Ir). Then, on the first electrode layer 34, a piezoelectric layer, in particular doped or undoped PZT (Pb, Zr, TiO3) or a kind of lead-free perovskite material, is deposited and subsequently shaped, e.g., through photolithography, to form a piezoelectric element 36. This step may include the use of a mask (not shown) and of an etching step (e.g., dry etching) to remove desired portions of the layer of piezoelectric layer so as to form the piezoelectric element 36 having a designed shape. Etching is stopped at the first electrode layer 32, which is not removed. The piezoelectric element 36 has a top surface 36a opposite, along Z direction, to a bottom surface 36b which directly faces (in particular, is in direct electrical contact with) the first electrode layer 34.

Figure 3:
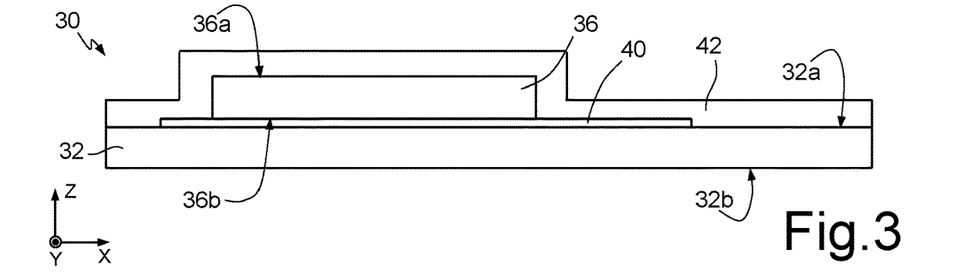

Then, in FIG. 3, a mask (for example, a photoresist mask, not shown) is formed; the mask is designed to protect the piezoelectric element 36, and to let portions of the first electrode layer 34 that are to be removed be exposed to an etchant. An etching step is then carried out, to remove the portions of the first electrode 34 not protected by the mask. A bottom electrode 40, for actuating the piezoelectric element 6 during use, is thus formed.

Then, the mask is removed and a step of deposition of a passivation layer 42 on the wafer 30 is carried out. The passivation layer 42 includes dielectric materials used for electrical insulation of the electrodes, for example $SiO_2$ or SiN or $Al_2O$ layers, either as single layers or a plurality of layers stacked on one another.

Figure 4:
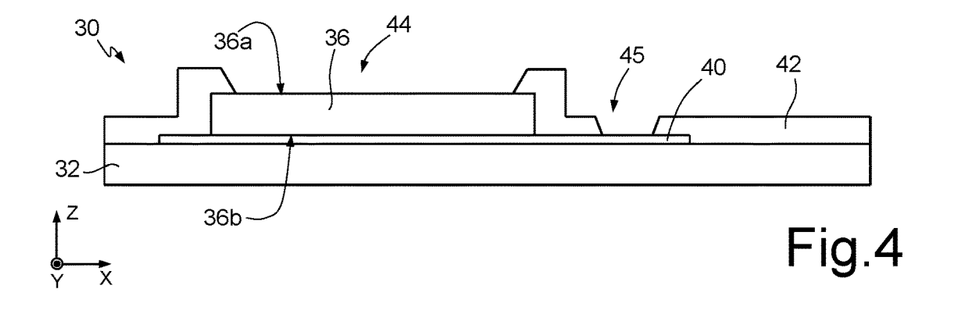

With reference to FIG. 4, vias 44, 45 are opened through the passivation layer 42, using the piezoelectric element 36 and the bottom electrode 34 as stopping layers, to expose surface regions of the piezoelectric element 36 and of the bottom electrode 34. In particular, it is noted that via 44 formed at the piezoelectric element 36 has, in top-plan view, an extension (area) which is about the same as the extension (area) of the piezoelectric element 36. The extension, in top-plan view, of the via 44 is chosen such as to expose a surface portion of the piezoelectric element 36 wide enough to provide sufficient contact area for a top electrode that will form, together with the bottom electrode 40, a piezoelectric stack for actuating the piezoelectric element 36. For example, the exposed surface portion of the piezoelectric element 36 is in the range 70-99% (ideally, 100%) of the surface area of the piezoelectric element 36. The surface of the piezoelectric element 36 considered in this context is the top surface 36a of the piezoelectric element 36 parallel to the XY plane and opposite, along the Z direction, to the bottom surface 36b of the piezoelectric element 36 which is in direct contact with the bottom electrode 40.

Figure 5:
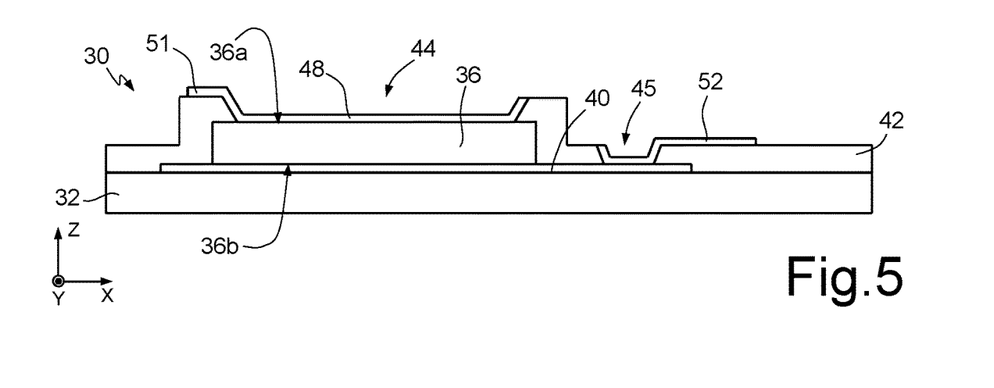

Then, in FIG. 5, a step of forming top electrode 48 is carried out, namely by depositing (e.g., sputtering) and patterning a film of conductive material, such as metal (e.g., Ru, TiW, Pt, Al, AlCu, Au, Mo, W-based materials) or non-metallic conductive materials (e.g. C-based materials, metallic oxides, etc.). The top electrode 48 is formed within the via 44, in particular in direct electrical contact with the piezoelectric element 36.

According to an aspect of the present embodiment, concurrently to the step of forming the top electrode 48, an optional step of forming conductive stripes 51, 52 is carried out, to provide electrical connections to bias the bottom electrode 40 and the top electrode 48, respectively. In particular, the conductive stripe 51 extends on the passivation layer 42 in electrical and mechanical continuity with the top electrode 48; the conductive stripe 52 extends within the via 45, in electrical contact with the bottom electrode 40, and on the passivation layer 42. As detailed in the following, the conductive stripes 51, 52 can be electrically contacted to provide, during use, the biasing voltage for driving the piezoelectric stack.

According to another embodiment, the electrical contacts can be formed directly at layer 44 and layer 45, as a function of the design and/or specific application requirements. That means that the conductive stripes 51, 52 are, in this embodiment, not formed.

Figure 6:
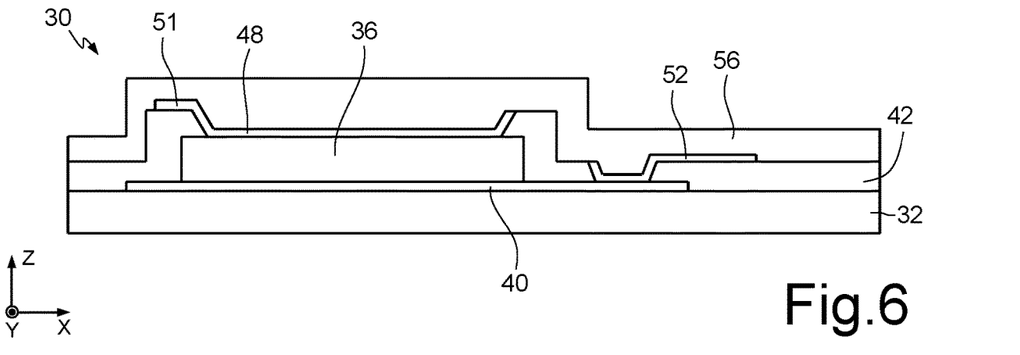

Then, in FIG. 6, a passivation layer 56 is formed on the wafer 30. The passivation layer 56 can be either organic or inorganic, for example, silicon nitride ($Si_xN_y$, in particular $Si_3N_4$) deposited by CVD. The passivation layer 56 completely covers the top electrode 48, the bottom electrode 40 and the conductive stripes 51, 52.

Figure 7:
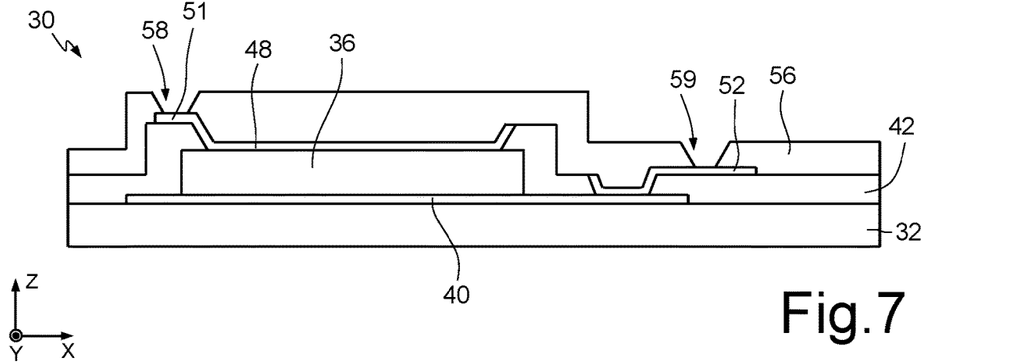

Then, in FIG. 7, openings 58, 59 are formed through the passivation layer 56 to reach and expose selective portions of the conductive stripe 51 and, respectively, conductive stripe 52.

Figure 8:
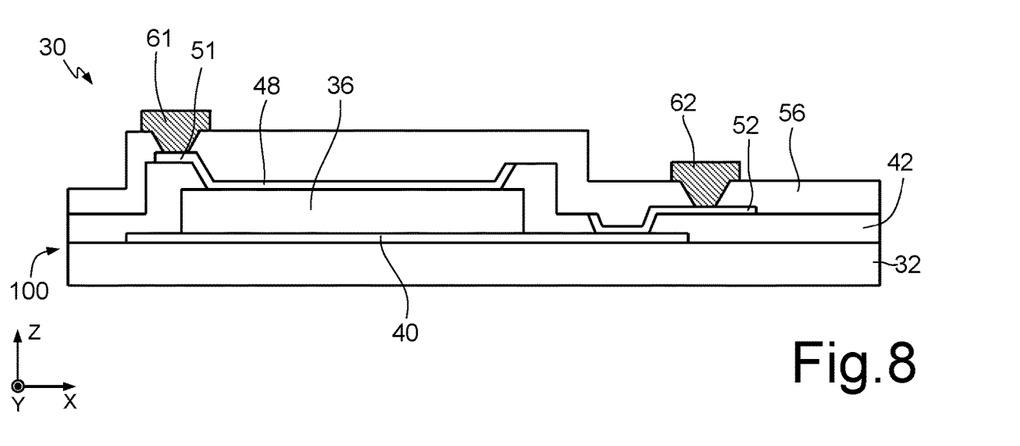

Metal contacts 61, 62 are then formed, in FIG. 8, within the openings 58, 59, to electrically contact the exposed selective portions of the conductive stripes 51 and 52, respectively. Alternatively, as outlined above, the electrical contacts can be done directly on layers 44 and 45.

Metal contacts 61, 62 can be used as pads for biasing, during use, the top electrode 48 and the bottom electrode 40 through the conductive stripes 51 and 52 respectively, so as to activate/operate the piezoelectric element 36.

In an embodiment, where the conductive stripes 51 and 52 are omitted, the metal contacts 61, 62, are also omitted. This embodiment is advantageous since further step(s) of metal deposition to form the conductive stripes and the pads is/are not carried out, thereby saving costs and reducing the manufacturing time.

A piezoelectric transducer 100 is thus formed.

The piezoelectric transducer 100 can be used, for example, to operate a liquid-ejection device.

Figure 9:
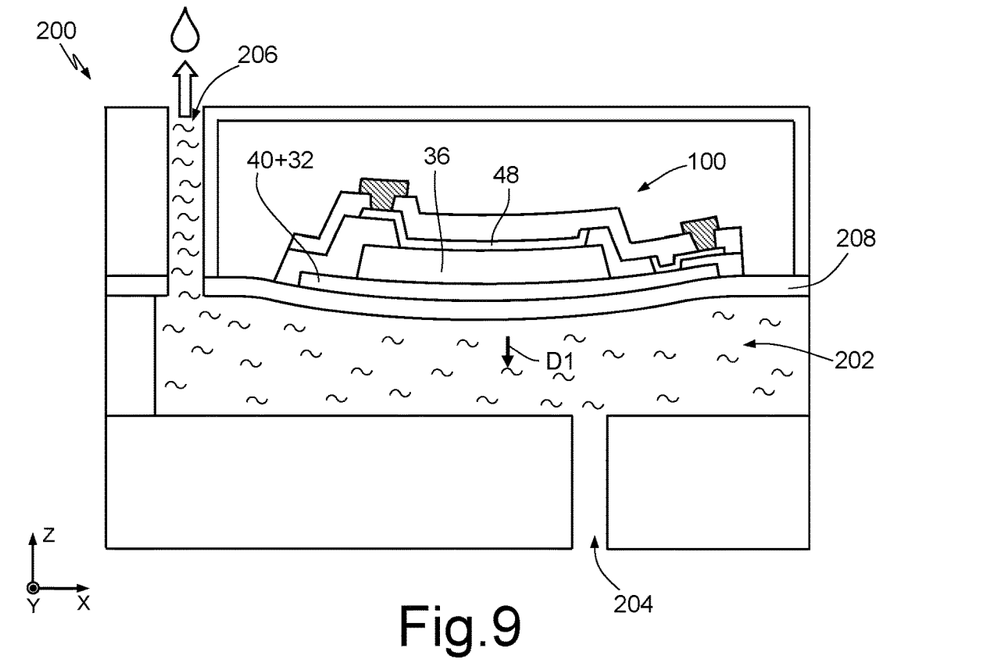
FIGS. 9 and 10 show a fluid-ejection device including the piezoelectric transducer manufactured according to FIGS. 2-8 during respective operative conditions.
Figure 10:
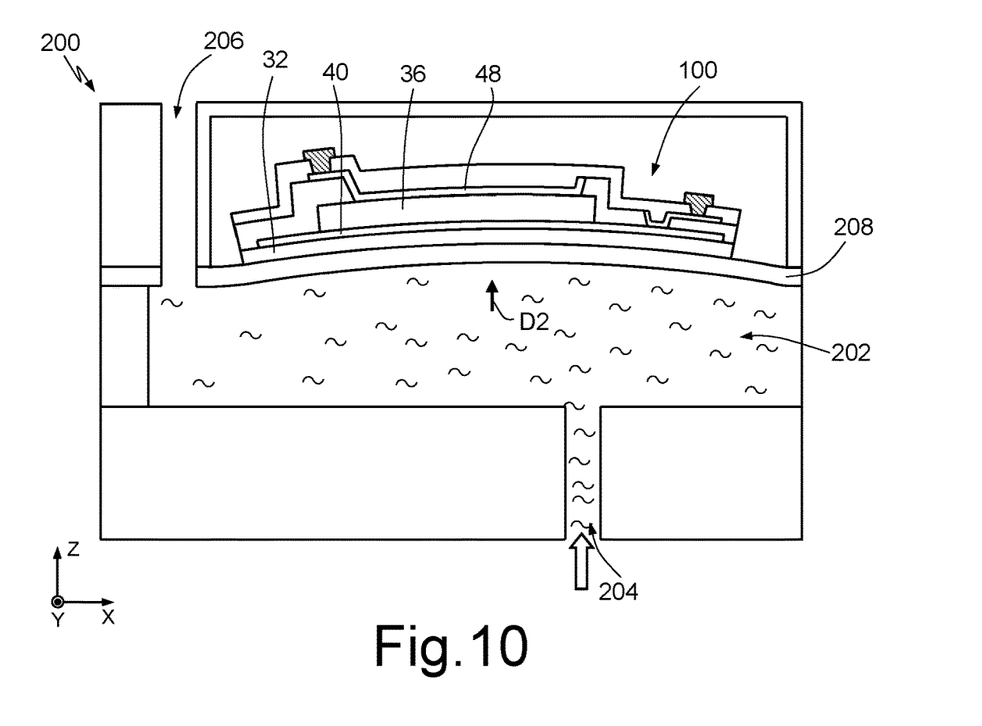

FIGS. 9 and 10 show schematically, in a cross-sectional view, a fluid ejection device 200 in respective operating states. The fluid ejection device 200 includes a body 201, e.g. of semiconductor material, within which a chamber 202 is present, adapted to be filled with a fluid that is to be ejected. The fluid is charged through an inlet channel 204 and ejected through a nozzle 206, both formed in the body 201 and fluidically coupled to the chamber 204. A membrane layer 208 faces the chamber 202.

In this case, the piezoelectric transducer 100 is mechanically coupled to the membrane layer 208 and is isolated from the fluid in the chamber 202. According to an alternative embodiment, not shown, the piezoelectric transducer 100 can be arranged on the membrane layer on a side of the membrane layer 208 that directly faces the chamber 202 and which is immersed, during use, in the fluid.

With reference to FIG. 9, the piezoelectric element 36 is controlled through the top electrode 48 and the bottom electrode 40 (which are biased through electrical connections, not shown) in such a way as to generate a deflection of the membrane layer 208 toward the inside of the chamber 202 (arrow D1). The deflection causes a movement of the fluid through toward the nozzle 206 and generates a controlled expulsion of a drop towards the outside of the fluid ejection device 200.

With reference to FIG. 10, the piezoelectric element 36 is controlled through the top electrode 48 and the bottom electrode 40 (which are biased through the electrical connections) in such a way as to generate a deflection of the membrane layer 208 in a direction opposite to that of FIG. 9 (arrow D2) so as to increase the volume of the chamber 202 and thus recalling further fluid towards the chamber 202 through the inlet channel 204. The chamber 202 is hence recharged with fluid.

The piezoelectric element may then again be actuated for the expulsion of a further drop of fluid. The steps of FIGS. 9 and 10 are repeated throughout the fluid-ejecting process.

Actuation of the piezoelectric element by biasing the top electrode 48 and bottom electrode 40 is in itself known and not described in further detail.

It is apparent that the piezoelectric transducer 100 can be employed in a variety of technical fields and applications, not limited to the fluid-ejection technology.

From an examination of the characteristics provided according to the present disclosure, the advantages that it affords are evident.

In particular, since the PZT element 36 is patterned before the top electrode 48 deposition, the top electrode 48 is not exposed to PZT resist/mask removal and cleaning steps, and therefore it is not subjected to possible damages deriving from said steps.

Moreover, since the top electrode 48 is formed after etching/patterning steps of the bottom electrode 40, the top electrode 48 is not exposed to resist/mask removal and cleaning steps performed in connection with the manufacturing of the bottom electrode 40, which may damage the top electrode 48.

Moreover, since the passivation layer 42 is formed before top electrode 48 formation, the top electrode 48, and the piezoelectric stack itself, are not subjected to thermal budgets related to the manufacturing of the passivation layer 42, which may damage the top electrode 48.

Moreover, since the vias/apertures 44, 45 through the passivation layer 42 are formed before the top electrode 48 formation, the top electrode 48 is not subjected to vias etch and cleaning steps, which may damage the top electrode 48.

Moreover, the steps of (i) forming the top electrode 48 and (ii) the conductive stripes 51, 52 are, in an embodiment, carried out at the same time. Therefore, further thermal budgets associated to a separate formation of the conductive stripes 51, 52 are avoided.

Finally, it is clear that modifications and variations may be made to what has been described and illustrated herein, without thereby departing from the sphere of protection of the present invention, as defined in the annexed claims.

For example, intermediate layers (not shown in the drawings) may be formed between the bottom electrode 34 and the piezoelectric element 36, and/or between the top electrode 48 and the piezoelectric element 36, with the aim of enhancing the electrical contact between them and/or the reciprocal mechanical adhesion.

The invention claimed is:

1. A method for manufacturing a piezoelectric transducer, comprising:
    depositing conductive material on a semiconductor body to form a bottom electrode;
    depositing piezoelectric material to form a piezoelectric element on the bottom electrode;
    depositing a first protective layer on and in direct contact with both the bottom electrode and the piezoelectric element;
    patterning the first protective layer to have a first opening through which a portion of said piezoelectric element is exposed and a second opening through which a portion of said bottom electrode is exposed;
    depositing a conductive layer on the first protective layer and within the first and second openings; and
    patterning said conductive layer to form:
        a top electrode in electrical contact with the piezoelectric element at said first opening,
        a first biasing stripe in electrical contact with the top electrode, and
        a second biasing stripe in electrical contact with the bottom electrode at said second opening.

2. The method according to claim 1, further comprising:
    depositing a second protective layer on the top electrode, the first biasing stripe, and the second biasing stripe; and
    etching the second protective layer at said first biasing stripe and second biasing stripe to form first and second vias for electrically contacting the first biasing stripe and the second biasing stripe, respectively.

3. The method according to claim 2, wherein depositing the first protective layer includes:
    depositing a plurality of passivation layers to completely cover the piezoelectric element and the bottom electrode; and
    wherein patterning the first protective layer comprises:
        locally removing said plurality of passivation layers at said piezoelectric element to form the first opening; and
        locally removing said plurality of passivation layers at said bottom electrode, laterally staggered with respect to said piezoelectric element, to form the second opening.

4. The method according to claim 3, wherein said plurality of passivation layers include an Aluminum Oxide layer and a Silicon Dioxide layer.

5. The method according to claim 1, wherein depositing the first protective layer comprises:
    depositing a plurality of passivation layers to completely cover the piezoelectric element and the bottom electrode; and
    wherein patterning the first protective layer comprises:
        locally removing portions of said plurality of passivation layers at said piezoelectric element to form the first opening; and locally removing portions of said plurality of passivation layers at said bottom electrode, laterally staggered with respect to said piezoelectric element, to form the second opening.

6. The method according to claim 5, wherein said plurality of passivation layers include an Aluminum Oxide layer and a Silicon Dioxide layer.

7. The method according to claim 1,
wherein depositing the conductive layer includes sputtering metal material on the first protective layer and within the first and second openings; and
wherein patterning the conductive layer includes etching selective portions of the sputtered metal material on the first protective layer to electrically isolate said sputtered metal material in the first opening from the sputtered metal material in the second opening.

8. The method according to claim 7, wherein etching selective portions of the sputtered metal material on the first protective layer includes carrying out an etching step using an etching mask which is shaped in such a way to allow removal of the sputtered metal material except for regions of the sputtered metal material which are designed to form said top electrode, first biasing stripe, and second biasing stripe.

9. The method according to claim 1, wherein said piezoelectric element is of PZT material.

10. A method, comprising:
depositing conductive material to form a bottom electrode;
depositing piezoelectric material to form a piezoelectric element;
depositing a first protective layer on and in direct contact with both the piezoelectric element and bottom electrode;
patterning the first protective layer to form a first opening through which a portion of said piezoelectric element is exposed and a second opening through which a portion of said bottom electrode is exposed;
depositing a conductive layer on the first protective layer and within the first and second openings; and
patterning said conductive layer to form:
a top electrode in electrical contact with the piezoelectric element at said first opening,
a first biasing stripe in electrical contact with the top electrode, and
a second biasing stripe in electrical contact with the bottom electrode.

11. The method according to claim 10, further comprising:
depositing a second protective layer on at least one of the top electrode, the first biasing stripe, and the second biasing stripe; and
etching the second protective layer at said first biasing stripe and second biasing stripe to form first and second vias for electrically contacting the first biasing stripe and the second biasing stripe.

12. The method according to claim 11, wherein depositing the first protective layer includes:
disposing a plurality of passivation layers to cover the piezoelectric element and the bottom electrode;
and wherein patterning the first protective layer comprises:
removing said plurality of passivation layers at said piezoelectric element, thereby forming the first opening; and
removing said plurality of passivation layers at said bottom electrode, thereby forming the second opening.

13. The method according to claim 12, wherein said plurality of passivation layers include an Aluminum Oxide layer and a Silicon Dioxide layer.

14. A piezoelectric transducer, comprising:
a bottom electrode of conductive material on a semiconductor body;
a piezoelectric element on, and in direct electrical contact with, the bottom electrode;
a first protective layer extending on and in direct contact with both the bottom electrode and the piezoelectric element, wherein the first protective layer includes a first opening reaching a portion of said piezoelectric element, and a second opening reaching a portion of said bottom electrode;
a top electrode in direct electrical contact with the piezoelectric element through said first opening;
a first biasing stripe on the first protective layer and in direct electrical contact with the top electrode; and
a second biasing stripe on the first protective layer and in direct electrical contact with the bottom electrode through said second opening.

15. The piezoelectric transducer according to claim 14, further comprising a second protective layer extending on, and in direct contact with, the top electrode, the first biasing stripe and the second biasing stripe, wherein the second protective layer has a first via at said first biasing stripe, and a second via at said second biasing stripe, exposing a surface portion of the first biasing stripe and, respectively, of the second biasing stripe.

16. The piezoelectric transducer according to claim 14, wherein the first protective layer includes a plurality of stacked passivation layers.

17. The piezoelectric transducer according to claim 16, wherein the plurality of stacked passivation layers comprise an Aluminum Oxide layer and a Silicon Dioxide layer.

18. The piezoelectric transducer according to claim 14, wherein said piezoelectric element is of PZT material.

19. A fluid ejection device, comprising:
a body having an inlet hole and an outlet nozzle;
a chamber within said body, configured to house a fluid to be ejected, fluidically coupled between said inlet hole and said outlet nozzle;
a membrane facing the chamber; and
a piezoelectric actuator arranged on the membrane and configured to be actuated in such a way to cause a displacement of the membrane toward the chamber and/or away from the chamber;
wherein the piezoelectric actuator comprises:
a bottom electrode of conductive material on a semiconductor body;
a piezoelectric element on, and in direct electrical contact with, the bottom electrode;
a first protective layer extending on and in direct contact with both the bottom electrode and the piezoelectric element, the first protective layer having a first opening reaching a portion of said piezoelectric element, and having a second opening reaching a portion of said bottom electrode;
a top electrode in direct electrical contact with the piezoelectric element through said first opening;
a first biasing stripe on the first protective layer, in direct electrical contact with the top electrode; and
a second biasing stripe on the first protective layer, in direct electrical contact with the bottom electrode through said second opening.

20. The fluid ejection device according to claim 19, wherein the piezoelectric actuator further comprises a second protective layer extending on, and in direct contact with, the top electrode, the first biasing stripe and the second biasing stripe, wherein the second protective layer has a first via at said first biasing stripe, and a second via at said second biasing stripe, exposing a surface portion of the first biasing stripe and, respectively, of the second biasing stripe.

21. The fluid ejection device according to claim 19, wherein the first protective layer includes a plurality of stacked passivation layers.

22. The fluid ejection device according to claim 21, wherein the plurality of stacked passivation layers comprise an Aluminum Oxide layer and a Silicon Dioxide layer.

\* \* \* \* \*